US009330752B2

(12) United States Patent
Yonezawa et al.

(10) Patent No.: US 9,330,752 B2
(45) Date of Patent: May 3, 2016

(54) MEMORY SYSTEM AND METHOD FOR WRITING DATA INTO MEMORY SYSTEM

(75) Inventors: Shinji Yonezawa, Tokyo (JP); Hirokuni Yano, Tokyo (JP); Toshikatsu Hida, Kanagawa (JP); Tatsuya Sumiyoshi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 250 days.

(21) Appl. No.: 13/328,420

(22) Filed: Dec. 16, 2011

(65) Prior Publication Data

US 2012/0159058 A1 Jun. 21, 2012

(30) Foreign Application Priority Data

Dec. 17, 2010 (JP) .................................. 2010-282299

(51) Int. Cl.
| | | |
|---|---|---|
| G06F 12/00 | (2006.01) | |
| G06F 13/00 | (2006.01) | |
| G06F 13/28 | (2006.01) | |
| G11C 11/56 | (2006.01) | |
| G06F 12/02 | (2006.01) | |
| G11C 16/04 | (2006.01) | |

(52) U.S. Cl.
CPC ........ *G11C 11/5628* (2013.01); *G06F 12/0246* (2013.01); *G06F 2212/7201* (2013.01); *G06F 2212/7207* (2013.01); *G11C 16/0483* (2013.01)

(58) Field of Classification Search
CPC .................................................... G11C 11/5628
USPC .......................................................... 711/102
See application file for complete search history.

(56) References Cited

U.S. PATENT DOCUMENTS 5,239,510 A * 8/1993 Hill ............................... 365/226
7,471,567 B1 * 12/2008 Lee et al. ................. 365/185.21

(Continued)

FOREIGN PATENT DOCUMENTS

| JP | 2004-192789 | 7/2004 |
| JP | 2009-205555 | 9/2009 |

(Continued)

OTHER PUBLICATIONS

NAND Flash Memories Application Note, ELNEC, Aug. 2008 (4 pages).*

(Continued)

*Primary Examiner* — Sanjiv Shah
*Assistant Examiner* — Daniel C Chappell
(74) *Attorney, Agent, or Firm* — Oblon, McClelland, Maier & Neustadt, L.L.P.

(57) ABSTRACT

A memory system of one embodiment includes: a nonvolatile memory including a plurality of word lines each connected to memory cells, each one of the memory cells being capable storing two bits, the memory cells connected to one of the plurality of word lines constituting an upper page and a lower page, each one of the pages being a unit of data programming; a random access memory configured to store an address translation table indicating relationships between logical addresses designated by a host and physical addresses in the nonvolatile memory. The memory system of the embodiment further includes a memory controller which execute data fixing for saving the address translation table from the random access memory to the nonvolatile memory; and write dummy data to at least one page subsequent to the page in which valid data has been written in the nonvolatile memory before executing the data fixing.

16 Claims, 10 Drawing Sheets

(56) References Cited

U.S. PATENT DOCUMENTS

| | | | |
|---|---|---|---|
| 7,568,146 B2* | 7/2009 | Takahashi et al. | 714/763 |
| 7,719,890 B2* | 5/2010 | Gorobets et al. | 365/185.04 |
| 7,953,920 B2 | 5/2011 | Yano et al. | |
| 7,962,688 B2 | 6/2011 | Yano et al. | |
| 8,065,470 B2 | 11/2011 | Yano et al. | |
| 8,065,471 B2 | 11/2011 | Yano et al. | |
| 8,780,635 B2* | 7/2014 | Li et al. | 365/185.17 |
| 8,930,614 B2* | 1/2015 | Masuo et al. | 711/103 |
| 8,982,617 B1* | 3/2015 | Mekhanik et al. | 365/185.02 |
| 9,092,320 B2* | 7/2015 | Mizushima | |
| 9,201,789 B1* | 12/2015 | Kang et al. | |
| 2005/0223154 A1* | 10/2005 | Uemura | 711/4 |
| 2006/0120162 A1* | 6/2006 | Fujiu et al. | 365/185.24 |
| 2006/0227624 A1* | 10/2006 | Shiga | 365/189.01 |
| 2007/0153577 A1* | 7/2007 | Guterman | 365/185.17 |
| 2007/0245070 A1* | 10/2007 | Mitsunaga | 711/103 |
| 2008/0019184 A1* | 1/2008 | Mitani et al. | 365/185.21 |
| 2008/0158960 A1* | 7/2008 | Sekar et al. | 365/185.09 |
| 2008/0158976 A1* | 7/2008 | Sekar et al. | 365/185.18 |
| 2008/0250220 A1* | 10/2008 | Ito | 711/173 |
| 2008/0316829 A1* | 12/2008 | Hemink | 365/185.17 |
| 2009/0168532 A1* | 7/2009 | Sel et al. | 365/185.17 |
| 2009/0222628 A1* | 9/2009 | Yano et al. | 711/135 |
| 2010/0042772 A1* | 2/2010 | Bonella et al. | 711/103 |
| 2010/0138591 A1 | 6/2010 | Yano et al. | |
| 2010/0161885 A1* | 6/2010 | Kanno et al. | 711/103 |
| 2010/0169551 A1* | 7/2010 | Yano et al. | 711/103 |
| 2010/0169597 A1* | 7/2010 | Yonezawa et al. | 711/162 |
| 2010/0205353 A1* | 8/2010 | Miyamoto et al. | 711/103 |
| 2011/0173380 A1 | 7/2011 | Yano et al. | |
| 2011/0185107 A1 | 7/2011 | Yano et al. | |
| 2011/0238899 A1 | 9/2011 | Yano et al. | |
| 2012/0008384 A1* | 1/2012 | Li et al. | 365/185.2 |
| 2012/0063231 A1* | 3/2012 | Wood et al. | 365/185.18 |
| 2013/0007346 A1* | 1/2013 | Khan | 711/103 |
| 2013/0294163 A1* | 11/2013 | Frost et al. | 365/185.11 |
| 2014/0149645 A1* | 5/2014 | Nakashita | 711/103 |
| 2014/0380119 A1* | 12/2014 | Sugahara et al. | 714/763 |

FOREIGN PATENT DOCUMENTS

| | | |
|---|---|---|
| JP | 2009-217755 | 9/2009 |
| JP | 2010-160873 | 7/2010 |

OTHER PUBLICATIONS

Definition of "meaningless", WordNet Search, retrieved from http://wordnetweb.princeton.edu/perl/webwn?s=meaningless on Jun. 5, 2013 (1 page).* http://wordnetweb.princeton.edu/perl/webwn?s=meaningless on Jun. 5, 2013 (1 page).*

NAND Flash Memories Application Note, ELNEC, Aug. 2008, retrieved from http://www.elnec.com/sw/an_elnec_nand_flash.pdf on Jun. 3, 2013 (44 pages).*

Definition of "padding", McGraw-Hill Dictionary of Scientific & Technical Terms, copyright 2003, retrieved from http://encyclopedia2.thefreedictionary.com/padding on Jun. 3, 2013 (1 page).*

U.S. Appl. No. 13/599,087, filed Aug. 30, 2012, Yonezawa, et al.

U.S. Appl. No. 13/609,991, filed Sep. 11, 2012, Hirao et al.

* cited by examiner

FIG.3A

| | BL0 | BL1 | BL2 | BL3 | ... | BLp | |
|---|---|---|---|---|---|---|---|
| WL0 | | | | | ... | | Lower Page 0 / Upper Page 0 |
| WL1 | | | | | ... | | Lower Page 1 / Upper Page 1 |
| WL2 | | | | | ... | | Lower Page 2 / Upper Page 2 |
| WL3 | | | | | ... | | Lower Page 3 / Upper Page 3 |
| ⋮ | ⋮ | ⋮ | ⋮ | ⋮ | ⋮ | ⋮ | ⋮ |
| WLq | | | | | ... | | Lower Page q / Upper Page q |

MEMORY CELLS (BL0, BL1)

FIG.3B

| |
|---|
| Lower Page 0 |
| Lower Page 1 |
| Upper Page 0 |
| Lower Page 2 |
| Upper Page 1 |
| Lower Page 3 |
| Upper Page 2 |
| Lower Page 4 |
| Upper Page 3 |
| Lower Page 5 |
| Upper Page 4 |
| Lower Page 6 |
| Upper Page 5 |
| Lower Page 7 |
| Upper Page 6 |
| Lower Page 8 |
| Upper Page 7 |
| ⋮ |

MEMORY SYSTEM AND METHOD FOR WRITING DATA INTO MEMORY SYSTEM

CROSS-REFERENCE TO RELATED APPLICATIONS

This application is based upon and claims the benefit of priority from Japanese Patent Application No. 2010-282299, filed on Dec. 17, 2010; the entire contents of which are incorporated herein by reference.

FIELD

Embodiments described herein relate generally to a memory system and a method for writing data into the memory system.

BACKGROUND

In recent years, NAND-type flash memories as nonvolatile semiconductor storage device have become increasingly higher in capacity, and SSDs (Solid State Drives) as memory systems equipped with such NAND-type flash memories have attracted attention. These memory systems are expected to enhance in reliability of data stored in the NAND-type flash memories.

BRIEF DESCRIPTION OF THE DRAWINGS

FIG. 3A is a diagram for describing one example of order of writing in an NAND flash memory, and is a diagram of arrangement of lower pages and upper pages corresponding to memory cell groups connected to word lines WLi;

FIG. 3B is a diagram for describing one example of order of writing in the NAND flash memory, and is a diagram of writing order of the pages;

DETAILED DESCRIPTION

Figure 1:
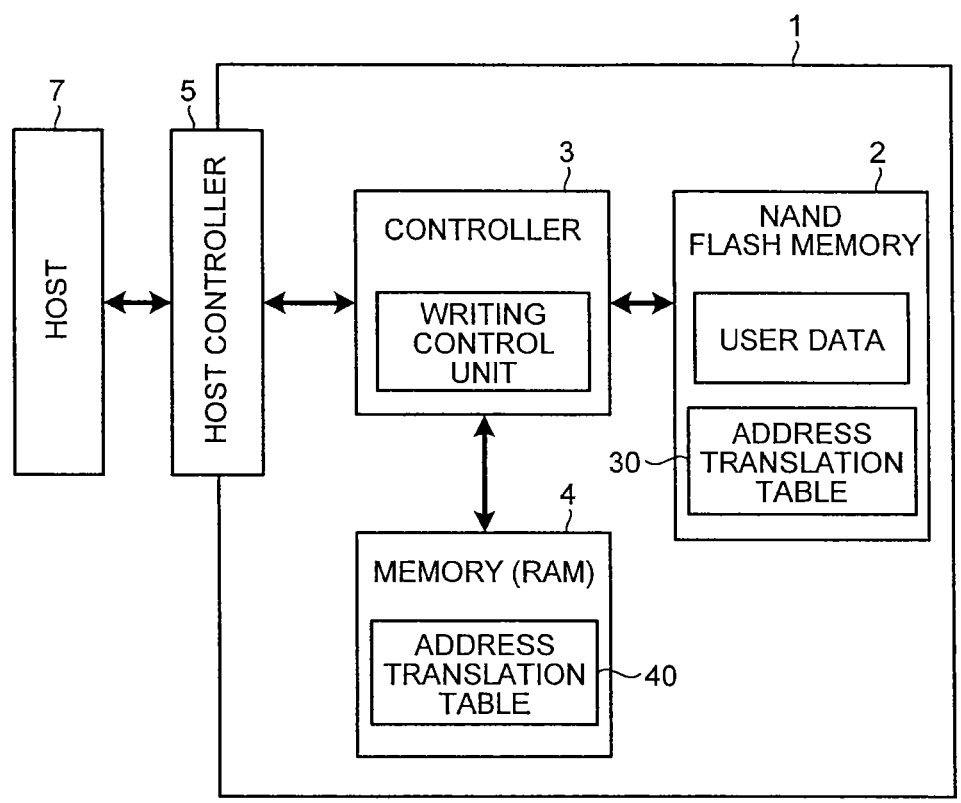
FIG. 1 is a block diagram of a configuration of a memory system according to an embodiment.

According to one embodiment, a memory system of the present invention includes: a nonvolatile memory including a plurality of word lines each connected to memory cells, each one of the memory cells being capable storing two bits, the memory cells connected to one of the plurality of word lines constituting an upper page and a lower page, each one of the pages being a unit of data programming in the nonvolatile memory; a random access memory configured to store an address translation table indicating relationships between logical addresses designated by a host apparatus and physical addresses in the nonvolatile memory. The memory system of the embodiment further includes a memory controller which execute data fixing process for saving the address translation table from the random access memory to the nonvolatile memory; and write dummy data to at least one page subsequent to the page in which valid data has been written in the nonvolatile memory before executing the data fixing process.

In writing into a multivalued memory cell of an NAND-type flash memory, it is known that, if an error (unsuccessful writing) or incorrect power discontinuity occurs during data writing into an upper page, there arises one defective phenomenon in which data cannot be read from a lower page corresponding to the upper page.

Meanwhile, the memory system needs to guarantee, after restarting, data written in the NAND-type flash memory at predetermined intervals or under an explicit instruction (a flash command, for example) from a host.

Accordingly, with respect to written data, the memory system makes nonvolatile a correspondence (address translation table) between physical addresses in the NAND-type flash memory (hereinafter, referred to as NAND addresses) and logical addresses designated by a host (hereinafter, referred to as "host addresses"), and performs a process for fixing of the written data (data fixing process).

However, if, after completion of the data fixing process, an error occurs at additional data writing into a block containing the already written data and the already written data is corrupted, the data confirmed at the foregoing data fixing process becomes incapable of being read.

For example, the assumption is made that data is written into a lower page and then a data fixing process is performed on the written data, and after that, data is written into an upper page sharing a word line with the lower page. If any error or incorrect power discontinuity occurs during writing into the upper page, the data in the lower page sharing the word line is corrupted.

As is described above, the memory system needs to guarantee the data written into the lower page prior to the data fixing process, and therefore some preventive measures need to be taken against such an event.

As an example of a preventive measure, the lower page at risk of being corrupted by an error during writing may be saved in advance in another place in the cases where additional data is written into the same block. However, if data is corrupted, a process for recovering the lower page becomes time-consuming and complicated.

As another measure, data of one block is completely written in a single operation. Unless additional data writing is performed within the same block, there is no need for preventive measures against data corruption due to writing error.

However, a size of data writable in a single operation becomes equal to a block size, which reduces writing efficiency in writing data of small sizes.

Exemplary embodiments of a memory system and a method for data writing in the memory system will be explained below in detail with reference to the accompanying drawings. The present invention is not limited to the following embodiments.

First Embodiment

FIG. 1 is a block diagram of a configuration of a memory system 1 according to a first embodiment. As illustrated in the diagram, the memory system 1 is connected to a host 7 such as a personal computer and functions as an external storage device of the host 7. In this configuration, the host 7 and the memory system 1 are connected by a communication interface in conformity with ATA (Advanced Technology Attachment) standards, for example. Writing/reading requests received by the memory system 1 from the host 7, each contain a beginning address as an access target defined by LBA (Logical Block Addressing) and a sector size indicative of a scope of a region of the access target.

The memory system 1 is configured to include: an NAND flash memory 2 as a nonvolatile semiconductor memory for storing user data and an address translation table 30; a controller 3 exercising data transfer control between the host 7 and the NAND flash memory 2 and controlling constituent elements in the memory system 1; a random access memory (RAM) 4 as a volatile semiconductor memory for storing temporarily at least part of the address translation table 40; and a host controller 5 as a host interface controller executing control of a communication interface with the host 7. That is, the random access memory 4 is configured to store the address translation table 40 indicating relationships between logical addresses designated by the host 7 and physical addresses in the NAND flash memory 2. The random access memory 4 is formed by a DRAM or an SRAM, for example.

The address translation table 40 shows correspondence between logical addresses designated by the host 7 and physical addresses indicative of positions of data within the NAND flash memory 2. The address translation table 30 is stored in the NAND flash memory 2, and is expanded in the random access memory 4 at a predetermined timing such as at a startup of the memory system 1. If the correspondence between the logical addresses and physical addresses is updated due to data writing or the like, the controller 3 updates the address translation table 40 expanded in the random access memory 4, but does not update the address translation table 30 within the NAND flash memory 2.

As is described above, if the latest address translation table 40 exists only in the random access memory 4, it is not possible to handle incorrect power discontinuity or the like. Therefore, the controller 3 writes the latest address translation table 30 into the NAND flash memory 2 so as to be made nonvolatile, at predetermined intervals or under an explicit instruction from the host. At this point of time, the data fixing process is completed, and after restarting, the address translation table 30 written into the NAND flash memory 2 is expanded in the random access memory 4, whereby it is possible to recover the state before the data fixing process. The controller 3 performs a data fixing process if the amount of updating of the address translation table 40 has reached a predetermined threshold value or if the controller 3 has received a flash command from the host 7.

Figure 2A:
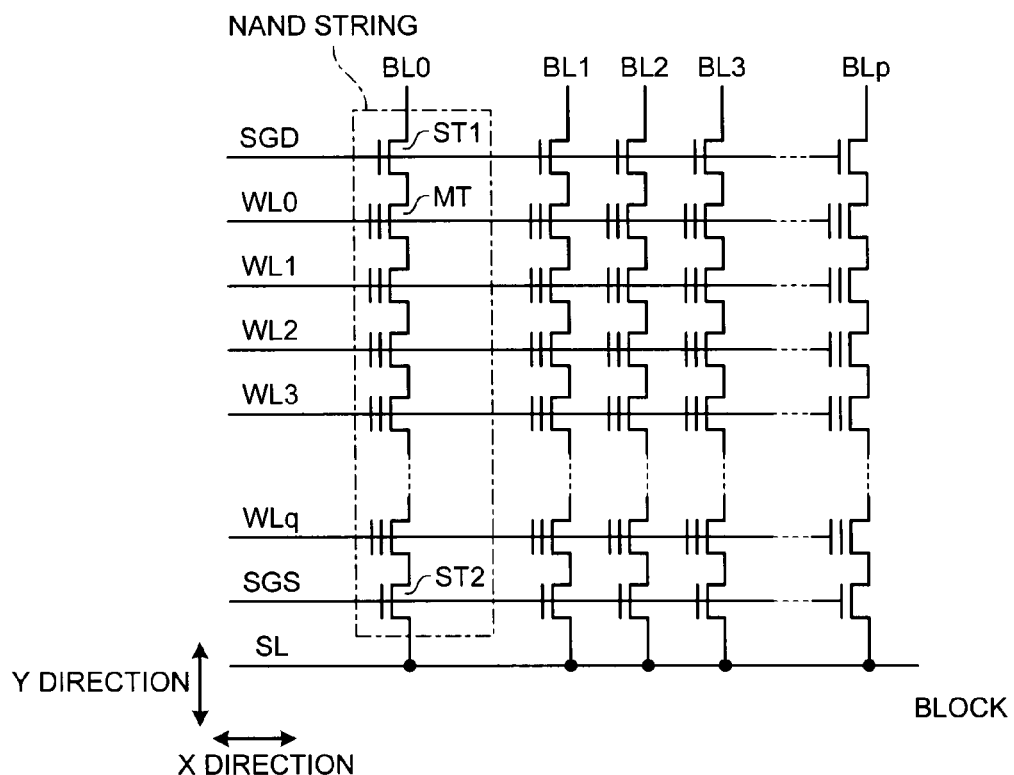
FIG. 2A is a diagram for describing physical blocks of an NAND memory chip, and is an equivalent circuit diagram of a configuration example of one physical block contained in the NAND memory chip.

The NAND flash memory 2 includes one or more NAND memory chips. In addition, each of the NAND memory chips is formed by arranging a plurality of physical blocks as a unit of data erasing. FIG. 2A is an equivalent circuit diagram illustrating a configuration example of one physical block contained in an NAND memory chip. Each of the physical blocks includes (p+1) NAND strings arranged in sequence along an X direction (p denotes an integer of 0 or more). Selection transistors ST1 contained in the (p+1) NAND strings are connected at drains to bit lines BL0 to BLp, and are connected at gates commonly to a gate line SGD. In addition, selection transistors ST2 are connected at sources commonly to a source line SL, and are connected at gates commonly to a selection gate line SGS.

Each of memory cell transistors MT is formed by an MOSFET (Metal Oxide Semiconductor Field Effect Transistor) including a layered gate structure on a semiconductor substrate. The layered gate structure includes an electric charge accumulation layer (floating gate electrode) formed via a gate insulating film on the semiconductor substrate, and a control gate electrode formed via an inter-gate insulating film on the electric charge accumulation layer. The memory cell transistors MT each vary in threshold voltage in accordance with the number of electrons accumulated in the floating gate electrode, and store data depending on variations in the threshold voltage. In this configuration, the memory cell transistors MT are each configured to store multiple values (data of 2 bits or more).

In addition, the memory cell transistors MT are not limited by a structure having a floating gate electrode, but may have another structure in which the threshold value can be adjusted by trapping electrons on an interface of a nitride film as an electric charge accumulation layer, such as MONOS (Metal-Oxide-Nitride-Oxide-Silicon)-type transistors.

In each of the NAND strings, the (q+1) memory cell transistors MT are disposed in such a manner that respective current paths are connected in series between the sources of the selection transistors ST1 and the drains of the selection transistors ST2. That is, a plurality of memory cell transistors MT is connected in series in a Y direction so as to share a diffusion region (source region or drain region) between adjacent ones.

In addition, control gate electrodes are connected to word lines WL0 to WLq in descending order of the memory cell transistor MT positioned nearest the drain side. Therefore, the drain of the memory cell transistor MT connected to the word line WL0 is connected to the source of the selection transistor ST1, and the source of the memory cell transistor MT connected to the word line WLq is connected to the drain of the selection transistor ST2.

The word lines WL0 to WLq connect in common the control gate electrodes of the memory cell transistors MT among the NAND strings within the physical block. Specifically, the control gate electrodes of the memory cell transistors MT in the same line of the block are connected to the same word line WL. The (p+1) memory cell transistors MT connected to the same word line WL are treated as one page (physical page). Data writing and data reading are performed by physical pages.

In addition, bit lines BL0 to BLp connect in common the drains of the selection transistors ST1 among the blocks. That is, the NAND strings in the same column in a plurality of blocks are connected to the same bit line BL.

Figure 2B:
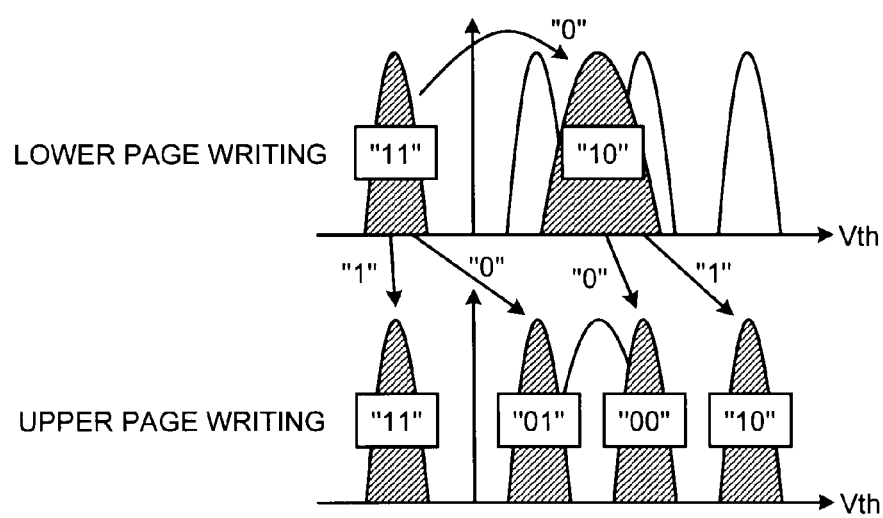
FIG. 2B is a diagram for describing physical blocks of an NAND memory chip, and is a schematic view of a threshold value distribution in 4-value data storage scheme in which 2 bits are stored in one memory cell transistor MT.

In some cases, a plurality of bits can be stored per memory cell transistor MT. For example, if n (n≥2) bits can be stored per memory cell transistor MT, the storage capacity per word line becomes equal to a data size of n pages. FIG. 2B is a schematic diagram illustrating a threshold value distribution in a 4-value data storage scheme in which 2-bit data is stored in one memory cell transistor MT, for example. In the 4-value data storage scheme, data of 2 pages can be stored per memory cell transistor MT. Pages with data written early are designated as lower pages, and pages with data written after the lower pages are designated as upper pages.

The memory cell transistors MT each can hold any one of 4-value data "xy" defined by upper page data "x" and lower page data "y." The 4-value data "xy" can be assigned data "11," "01," "00," and "10," in order of threshold voltages of the memory cell transistors MT, for example. The data "11" indicates that the threshold voltage of the memory cell transistor MT is negative and the memory cell transistor MT is in an erased state. The rule for data assignment is not limited to this. In addition, in the following explanation of this embodiment, one memory transistor MT can store a 2-bit value, but one memory cell transistor MT may be configured to store a 3-bit value or more. In the following description, the memory cell transistor MT may be expressed as simply a memory cell.

In a lower page writing operation, the data "10" is selectively written into the memory cells with the data "11" (erased state) by writing the lower bit data "y." In an upper page writing operation, the upper bit data "x" is selectively written into the memory cells with the data "11" and the memory cells with the data "10" so that the data "01" and data "00" are written. The threshold value distribution of the data "10" before the upper page writing, is located in an almost middle between the threshold value distributions of the data "01" and data "00" after the upper page writing, and is generally broader than the threshold value distribution after the upper page writing.

In writing of user data, the threshold voltage of the memory cells varies under the influence of a coupling capacity between adjacent memory cells. Accordingly, to alleviate the influence of the coupling capacity of adjacent memory cells, the writing orders of lower pages and upper pages are devised so as not to be overlapped in each of the word lines WLi. FIGS. 3A and 3B are diagrams for describing one example of writing order into the NAND flash memory 2. As illustrated in FIG. 3A, first, assumption is made that: i denotes an integer of 0 or more; lower pages in memory cell groups connected to the word lines WLi are designated Lower Pages i; and upper pages in the same are designated as Upper Pages i. Each one of the Pages is a unit of data programming in the NAND flash memory 2.

As illustrated in FIG. 3B, after writing is made into the lower page in the head of the block (Lower Page 0), writing is performed in order of (1) Lower Page 2i+1, (2) Upper Page 2i, (3) Lower Page 2i+2, and (4) Upper Page 2i+1. At an end of the writing in (4), i is incremented by one, and writing into the destination shown by (1) is performed. As in the foregoing, in each of the word lines, the writing into the lower pages (1) and (2) and the following writing into the upper pages (3) and (4) are made discontinuous in terms of page addresses (in this case, by 2 or 3 pages).

Figure 4:
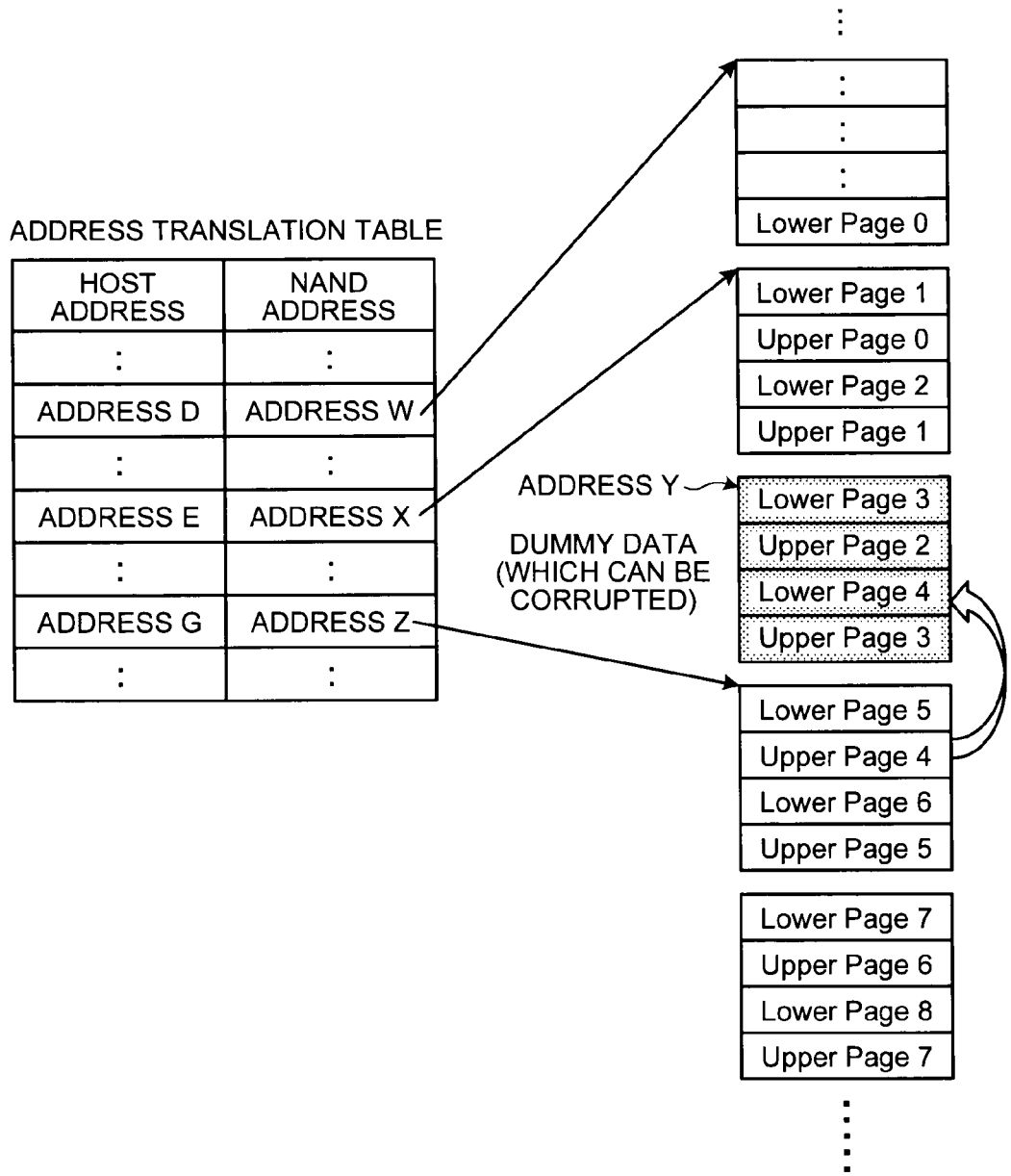
FIG. 4 is a diagram illustrating correspondence between an address translation table and arrangement of pages given addresses in NAND blocks according to the embodiment.

The foregoing writing order is one example of writing order intended for reduction in proximity effect. This embodiment is described on the assumption that, in the page arrangement illustrated in FIG. 3A, writing is performed in sequence from top down with respect to the column of pages illustrated in FIG. 3B. FIG. 4 illustrates one example of an address translation table. In this embodiment, addresses in the NAND flash memory 2 are managed by 4 pages, and the unit of address translation is set at 4 pages in the address translation table managed by the random access memory 4 illustrated on the left side of FIG. 4. However, address translation by 4 pages is one example, and the unit of address translation is not limited to this.

In this embodiment, prior to the above-mentioned data fixing process in which the address translation table is copied from the random access memory 4 to the NAND flash memory 2, the controller 3 records dummy data subsequent to the already written valid data. If the timing for recording of the dummy data is limited to before the data fixing process, it is possible to prevent the confirmed written valid data from being corrupted due to an error in additional writing while avoiding reduction in writing efficiency.

The procedure for writing dummy data in the memory system 1 in the embodiment will be described below in detail, referring to FIG. 4, the time chart in FIG. 5, and the flow chart in FIG. 6.

Figure 5:
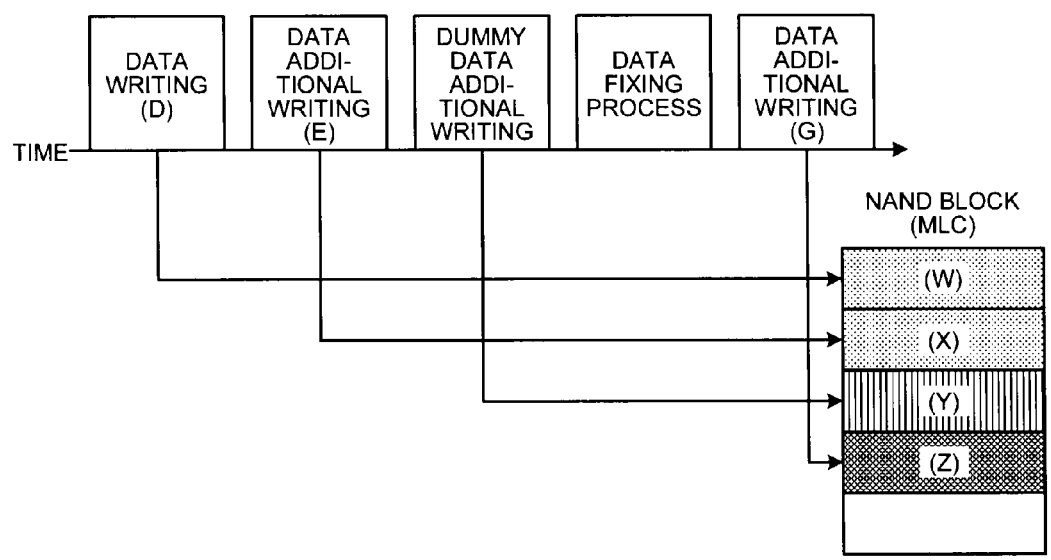
FIG. 5 is a time chart of a process flow of data writing including writing dummy data into the NAND blocks according to the embodiment.
Figure 6:
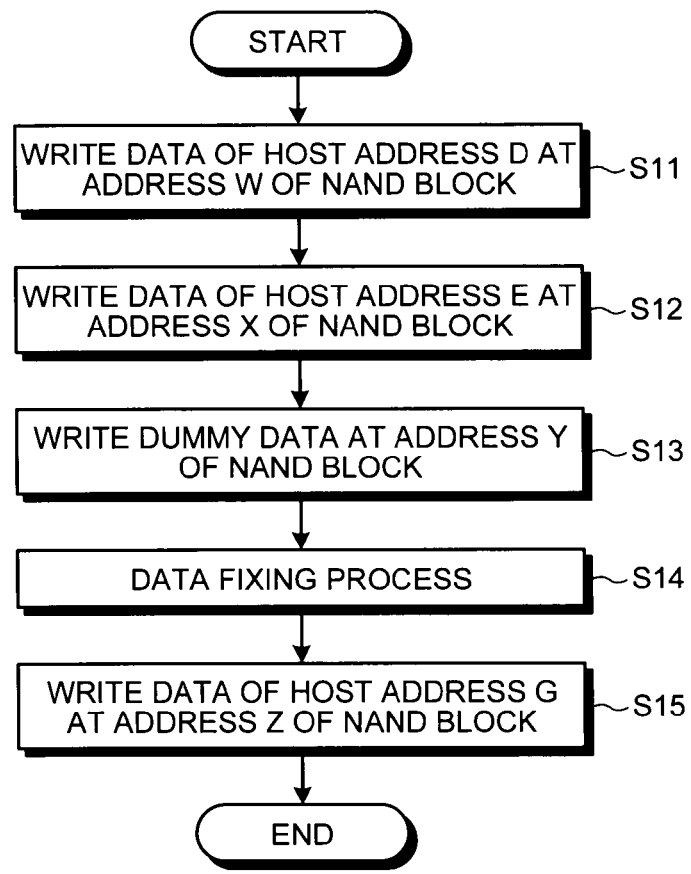
FIG. 6 is a flow chart of a flow of data writing process including writing dummy data into NAND blocks according to the embodiment.

First, the controller 3 uses the writing control unit to write data into a host address (logic address) D (FIG. 5 and step S11 in FIG. 6). The controller 3 writes valid data into a region at an NAND address W belonging to one NAND block within the NAND flash memory 2, and then writes this correspondence into the address translation table managed by the random access memory 4. As illustrated in the right side of FIG. 4, the final page of the region at the NAND address W is the lower page 0.

In addition, the controller 3 writes valid data into a region at an NAND address X within the NAND block, as data writing into a host address E (FIG. 5 and step S12 in FIG. 6). Then, the controller 3 writes this correspondence into the address translation table. As illustrated in the right side of FIG. 4, the region at the NAND address X includes Lower Page 1, Upper Page 0, Lower Page 2, and Upper Page 1.

After that, before execution of the data fixing process (step S14 illustrated in FIG. 6), the controller 3 fills pages likely to be corrupted due to subsequent additional writing (step S15), with dummy data (FIG. 5 and step S13 illustrated in FIG. 6). That is, the controller 3 executes data fixing process for saving the address translation table from the random access memory 4 to the nonvolatile memory; and writes dummy data to at least one page subsequent to the page in which valid data has been written in the NAND flash memory 2 before executing the data fixing process. Specifically, the controller 3 writes dummy data into all the regions at an NAND address Y within the NAND block, formed by the four pages illustrated in FIG. 4: Lower Page 3, Upper Page 2, Lower Page 4, and Upper Page 3. The address Y indicates the regions in the NAND block with no host address (logical address) that cannot be referred to from the address translation table managed by the random access memory 4. The dummy data to be written can be either of 2 values.

Subsequently, the controller 3 copies the address translation table from the random access memory 4 into the NAND flash memory 2, thereby executing the data fixing process (FIG. 5 and step S14 illustrated in FIG. 6). Accordingly, the data written at the host address D before the data fixing process and the data additionally written at the host address E can be ensured. The controller 3 does not write dummy data after executing the data fixing process.

Further, the controller 3 writes valid data into regions at an address Z within the NAND block as data writing at a host address G (FIG. 5 and step S15 illustrated in FIG. 6). Then, the controller 3 writes this correspondence into the address translation table. As illustrated in the right side of FIG. 4, the regions at the address Z includes Lower Page 5, Upper Page 4, Lower Page 6, and Upper Page 5. At this time, even if any error occurs in writing into Upper Page 4 and the data on Lower Page 4 is corrupted, there is no problem because of the presence of the dummy data.

As is in the foregoing, when dummy data additional writing process (step S13) is performed, even if, after execution of the data fixing process (step S14), the additional writing (step S15) is performed and the already written pages corresponding to the same word lines are corrupted due to a writing error or incorrect power discontinuity, only the pages with the dummy data are corrupted as illustrated in the right side of FIG. 4. Accordingly, it is possible to prevent that the data recorded before the data fixing process is corrupted.

The unit of address translation, 4 pages, in this embodiment is selected as the number of regions into which dummy data is to be written at step 13 illustrated in FIG. 6 (that is, a size of dummy data to be written). However, even if dummy data is written into a smaller number of pages, it is possible to avoid the corruption of the data recorded before the data fixing process as described below.

For example, with regard to the order of page writing illustrated in the right side of FIG. 4, a maximum distance between the lower page and the upper page in the writing order corresponding to the same word line is 3 by the number of pages. Specifically, Lower Page 0 and Upper Page 0 corresponding to the same word line are separated by 2 pages in the writing order, whereas other pairs of the lower pages and the upper pages corresponding to the same word lines, for example, Lower Page 1 and Upper Page 1, Lower Page 2 and Upper Page 2, Lower Page 3 and Upper Page 3, . . . are all separated by 3 pages. Therefore, in the order of page writing illustrated in the right side of FIG. 4, the maximum distance represented by the number of pages between the lower page and the upper page corresponding to the same word line is 3 in the writing order. Accordingly, when the maximum distance represented by the number of pages in the writing order between the lower page and the upper page corresponding to the same word line can be determined, it is possible to reliably avoid corruption of confirmed data by writing dummy data by the pages of the maximum distance or more before the data fixing process. That is writing dummy data with a maximum distance or more of pages, and the maximum distance is a number of pages in terms of writing order between the upper page and the lower page assigned to the same word line. In this case, writing dummy data of 3 pages is sufficient.

In addition, even if the order of page writing illustrated in the right side of FIG. 4 is used as it is but the number of pages as unit of address translation is not less than 4, such as 8, it is only needed to write dummy data of pages of the maximum distance or more by the number of pages between the lower page and the upper page corresponding to the same word line in the writing order as described above, and therefore writing dummy data of 3 pages is sufficient. Although dummy data of 3 pages or more may be written before each data fixing process, it is possible to simplify the process by writing dummy data of a fixed (predetermined) number of pages equal to or larger than the maximum distance.

However, as described above in relation to the embodiment, if the number of pages (4 pages) as unit of address translation in the address translation table is equal to or larger than the maximum distance (3 pages), it is possible to further simplify the process by writing dummy data of 4 pages that is the number of pages as unit of address translation. In other words, if a number of pages collectively managed in the address translation table is equal to or larger than the maximum distance, the controller 3 writes dummy data with the number of pages collectively managed in the address translation table. Conversely, if the number of pages as unit of address translation in the address translation table is smaller than the maximum distance, for example, if the maximum distance is 3 pages and the unit of address translation is 1 page, it is sufficient to write dummy data of pages of the maximum distance.

In addition, in the embodiment described above, one memory cell transistor MT stores 2-bit data, that is, n=2. However, even if n is larger than 2, it is possible to prevent corruption of already written valid data due to additional writing of page(s) corresponding to the same word lines. Specifically, the same advantage can be obtained by, before execution of the data fixing process, determining all the distances by the number of pages between two each pages selected from n pages corresponding to the same word lines in the writing order, and then writing dummy data of pages of the maximum distance or more among the determined distances, before execution of the data fixing process and after writing of the valid data.

Figure 7:
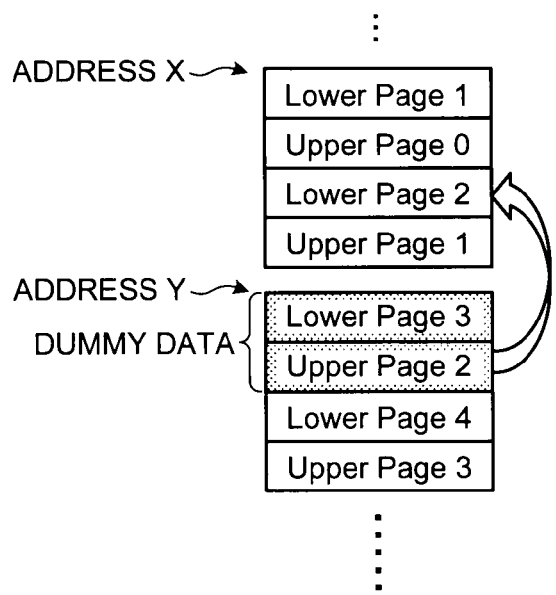
FIG. 7 is a diagram illustrating that dummy data is written into an upper page to protect a lower page into which valid data which belongs to the same word line is written according to the embodiment.

Further, it is also possible to further reduce the number of dummy data by writing dummy data of equal to or larger than the maximum distance value by the number of pages in the order of writing pages corresponding to the same word line described above. Specifically, in the foregoing embodiment, if valid data is written into regions at the address X within the NAND block at step S12 illustrated in FIG. 6 and then the data fixing process is to be executed, it is possible to actually avoid corruption of the already written valid data due to an error occurring in additional writing after the data fixing process, only by writing dummy data into Upper Page 2 out of the regions at the address Y to protect Lower Page 2 into which the valid data is written, as illustrated in FIG. 7. That is, the data corruption can be avoided only by writing dummy data into all the not yet written upper page(s) belonging to the same word line as the lower page into which the valid data is written (in this case, only Upper Page 2 is applicable and thus dummy data of 1 page is written) before the execution of the data fixing process. In other words, the controller 3 writes dummy data to all unwritten upper pages assigned to the same word lines as the lower pages in which valid data has been written before executing the data fixing process. This allows the unstable lower page to be protected by dummy data.

In this case, however, unless valid data is written into Lower Page 3, it is not possible to appropriately write data into Upper Page 3 corresponding to the same word line as Lower Page 3, into which valid data is to be written after the data fixing process. Therefore, it is desired to write dummy data into Lower Page 3 as well. Specifically, it is desired to write dummy data into two pages (Lower Page 3 and Upper Page 2 illustrated in FIG. 7) that, out of the not yet written upper pages belonging to the same word line as the lower page into which valid data is written, constitute all the not yet written pages in the writing order up to the last not yet written upper page (the upper page 2 illustrated in FIG. 7). In other words, the controller 3 writes dummy data to all unwritten upper and lower pages up to the last unwritten upper page in terms of writing order among all unwritten upper pages assigned to the same word lines as the lower pages in which valid data has been written. In this case, similarly, if the number of all not yet written pages, out of the not yet written upper pages belonging to the same word line as the lower page into which valid data is written, in the writing order up to the last not yet written upper page, is equal to or less than the number of pages as unit of address translation, the process can be more simplified by writing dummy data of the number of pages as unit of address translation. In other words, if a number of pages collectively managed in the address translation table is equal to or larger than a number of all the unwritten pages, the controller 3 writes dummy data with the number of pages collectively managed in the address translation table.

In addition, the example illustrated in FIG. 7 is applicable to the case where one memory cell transistor MT stores 2-bit data, that is, n=2. However, even if n is larger than 2, it is possible to prevent corruption of already written valid data due to additional writing of page(s) corresponding to the same word lines. Specifically, it is possible to prevent corruption of valid data having been subjected to the data fixing process, by writing dummy data into all the not yet written pages belonging to the same word lines as the pages into which the valid data is written, before the execution of the data fixing process. In this case, similarly, it is possible to write dummy data into all not yet written pages, out of the not yet written pages belonging to the same word lines as the pages into which the valid data is written, in the writing order up to the last not yet written page. If the number of all the not yet written pages in the writing order up to the last not yet written page, is equal to or less than the number of pages as unit of address translation, the process can be more simplified by writing dummy data of the number of pages as unit of address translation.

Figure 8:
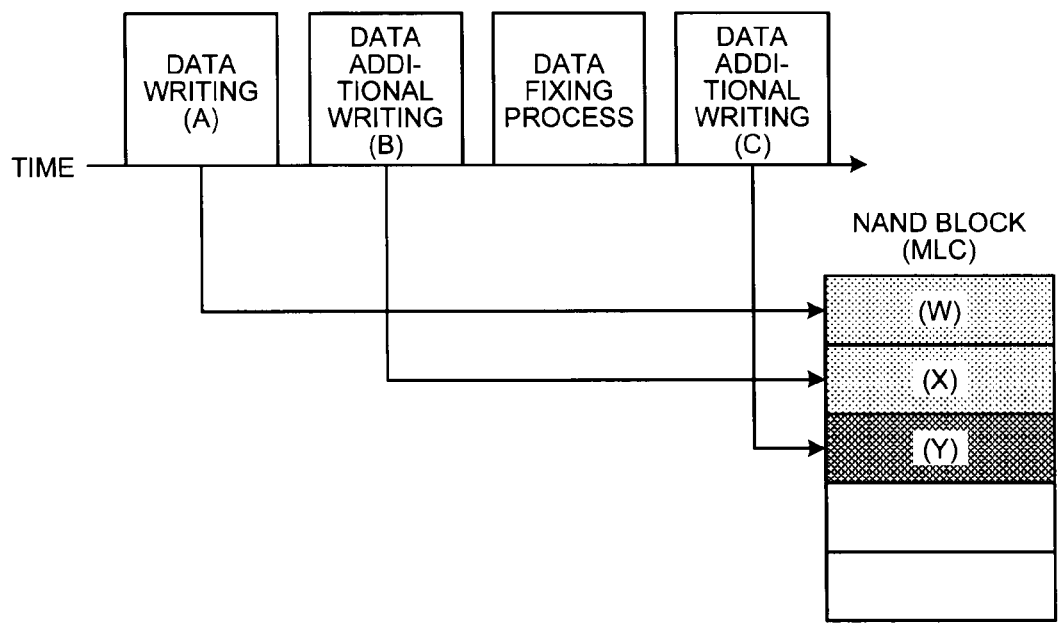
FIG. 8 is a time chart of a process flow of data writing into NAND blocks in a comparative example.
Figure 9:
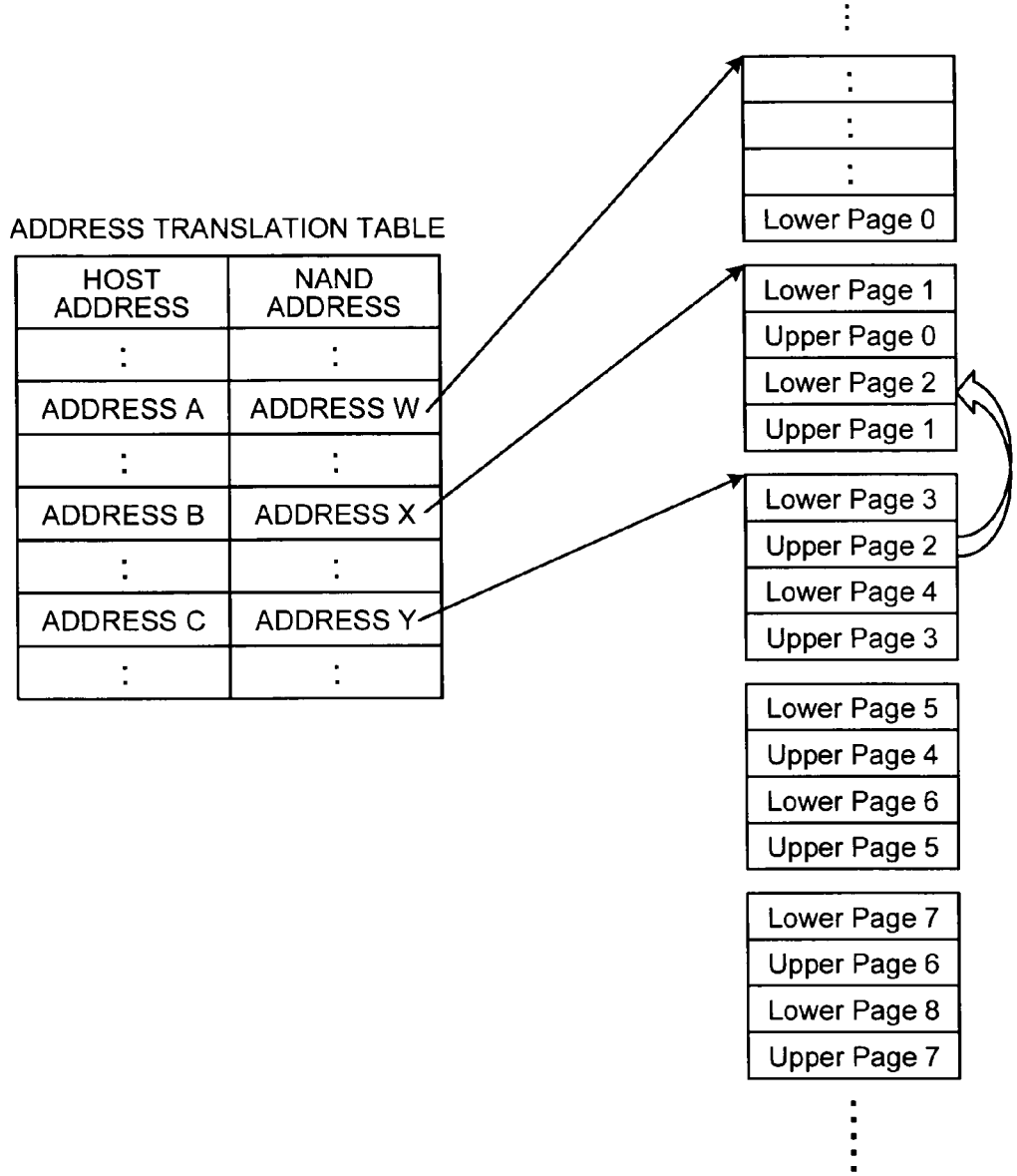
FIG. 9 is a diagram illustrating correspondence between an address translation table and arrangement of pages given addresses in NAND blocks in a comparative example.

In a comparative example as illustrated in FIG. 8, for example, after two writing operations at host addresses A and B with respect to the NAND block are executed with respect to NAND addresses W and X of the NAND block, the data fixing process is performed, and then additional data writing at host address C is performed with respect to NAND address Y of the NAND block. In the additional data writing at the NAND address Y, when data is written into Upper Page 2 belonging to the same word line as Lower Page 2 with valid data which has been subjected to the data fixing process, as illustrated in FIG. 9, a writing error or incorrect power discontinuity may occur. In this case, the data on Lower Page 2 corresponding to Upper Page 2 is corrupted (FIG. 9). That is, there arises a phenomenon in which the data written before the data fixing process is not guaranteed.

The dummy data may be all 1 data, all 0 data, or random data with an almost equal ratio between 1 and 0. In other words, the dummy data may be comprised of random data. If the dummy data is all 1 data, application of a writing voltage into the word lines may be omitted. In addition, pages storing the dummy data may be identified by flags added to the address translation table, or the NAND addresses of these pages may not be registered with the address translation table.

In the embodiment as described above, it is possible to avoid the problem by writing dummy data before the data fixing process. That is, it is possible to achieve reliability improvement by stabilizing the state of the memory cells into which data is written before the data fixing process. In addition, since the timing for writing dummy data is decided as only before the data fixing process, it is possible to suppress reduction in writing efficiency. In addition, in the foregoing description of this embodiment, a writing method with reduction in proximity effect in order of page writing is exemplified. Needless to say, however, this embodiment is also applicable to the cases where the order of page writing in the sequence of word lines with no consideration given to proximity effect is used.

Second Embodiment

Figure 10:
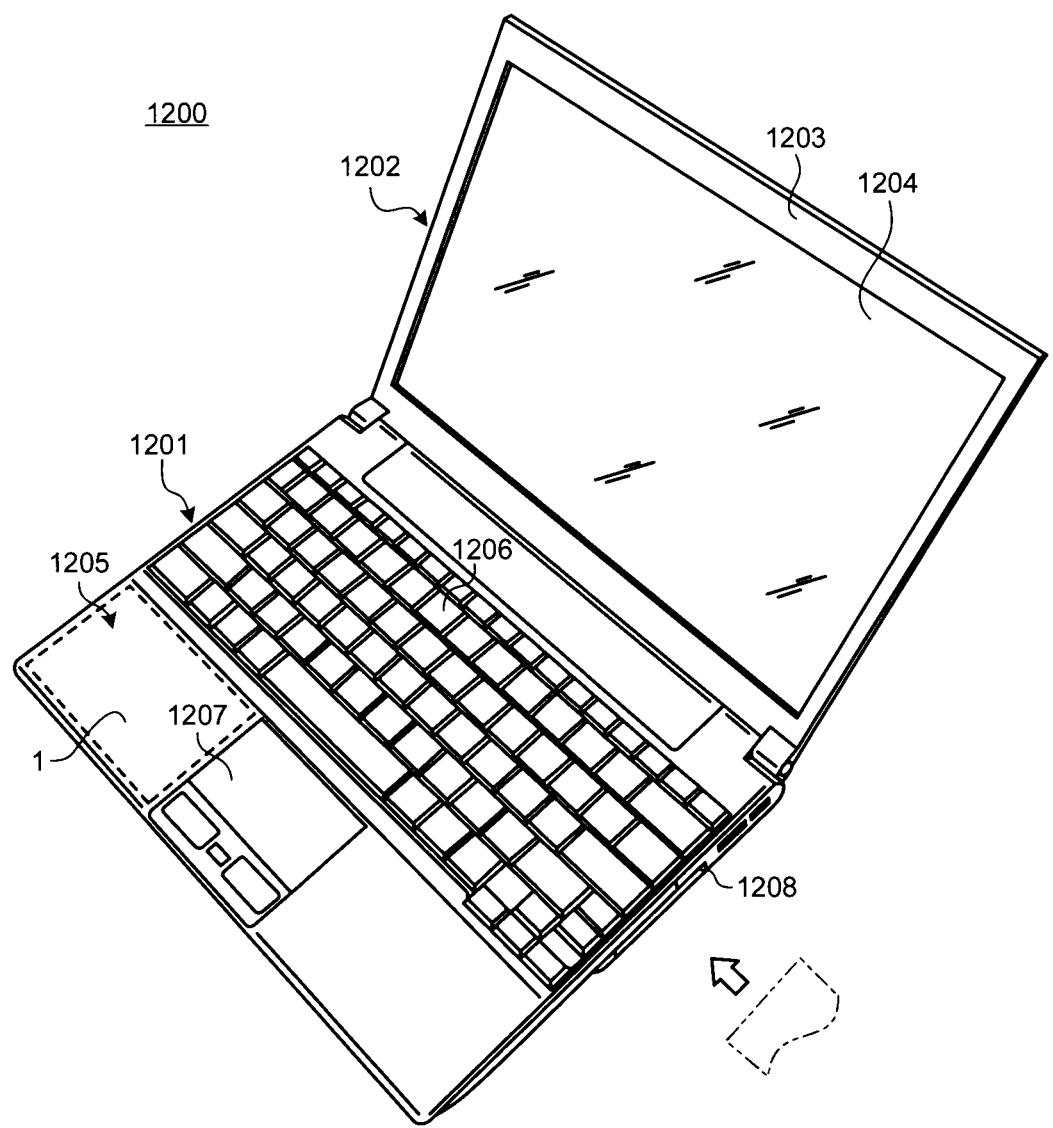
FIG. 10 is a perspective view of an appearance of a personal computer.

FIG. 10 is a perspective view illustrating one example of a personal computer 1200 equipped with the memory system 1 (SSD). The memory system 1 (SSD) is, for example, the memory system 1 explained in the first embodiment. The personal computer 1200 includes a main body 1201 and a display unit 1202. The display unit 1202 includes a display housing 1203 and a display device 1204 stored in the display housing 1203.

The main body 1201 includes a cabinet 1205, a keyboard 1206, and a touch pad 1207 as a pointing device. The cabinet 1205 contains a main circuit board, an ODD (Optical Disk Device) unit, a card slot, the memory system 1, and the like.

The card slot is provided adjacent to a peripheral wall of the cabinet 1205. An opening part 1208 is provided opposed to the card slot on the peripheral wall. A user can insert and withdraw an additional device into/from the card slot through the opening part 1208 from/to the outside of the cabinet 1205.

The memory system 1 can be used in the state of being implemented within the personal computer 1200 in place of a conventional HDD, or can be used as an additional device in the state of being inserted into the card slot provided in the personal computer 1200.

Figure 11:
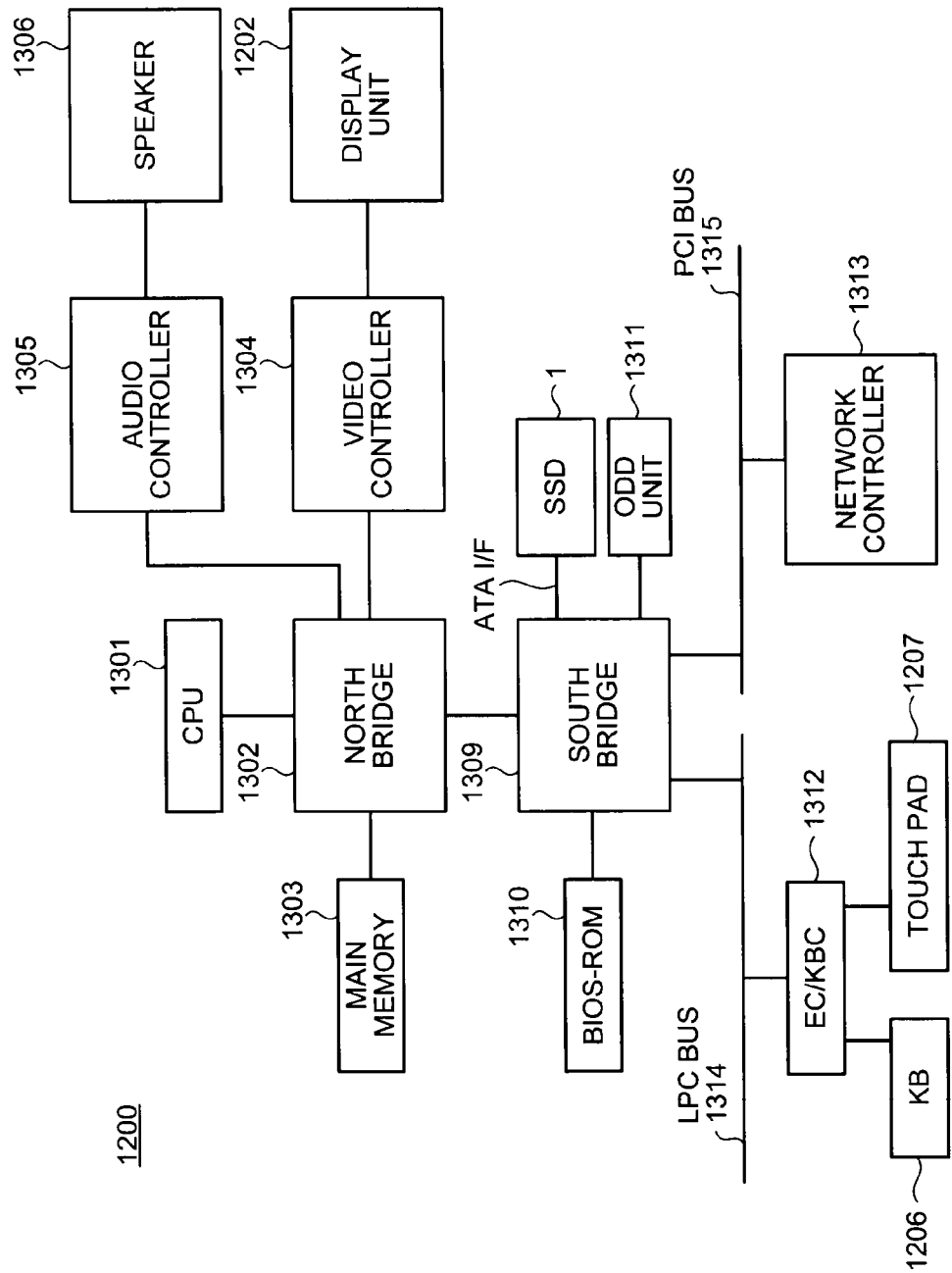
FIG. 11 is a diagram illustrating an example of a functional configuration of the personal computer.

FIG. 11 illustrates an example of a system configuration of a personal computer equipped with the memory system 1 (SSD). The personal computer 1200 includes a CPU 1301, a north bridge 1302, a main memory 1303, a video controller 1304, an audio controller 1305, a south bridge 1309, a BIOS-ROM 1310, the memory system 1, an ODD unit 1311, an embedded controller/keyboard controller IC (EC/KBC) 1312, a network controller 1313, and the like.

The CPU 1301 is a processor provided for controlling operation of the personal computer 1200, and runs an operating system (OS) loaded from the memory system 1 into the main memory 1303. Further, if the ODD unit 1311 enables execution of at least one of a reading process and a writing process with respect to a loaded optical disc, the CPU 1301 executes the process(es).

In addition, the CPU 1301 also runs a system BIOS (Basic Input Output System) stored in the BIOS-ROM 1310. The system BIOS is a program for hardware control within the personal computer 1200.

The north bridge 1302 is a bridge device to connect between a local bus of the CPU 1301 and the south bridge 1309. The north bridge 1302 also contains a memory controller to control access to the main memory 1303.

In addition, the north bridge 1302 also has the functions of communicating with the video controller 1304 and communicating with the audio controller 1305, via an AGP (Accelerated Graphics Port) bus or the like.

The main memory 1303 stores temporarily programs and data, and functions as a work area of the CPU 1301. The main memory 1303 is formed by a RAM, for example.

The video controller 1304 is a video replay controller to control the display unit 1202 used as a display monitor of the personal computer 1200.

The audio controller 1305 is an audio replay controller to control a speaker 1306 of the personal computer 1200.

The south bridge 1309 controls the devices on an LPC (Low Pin Count) bus 1314, and controls the devices on a PCI (Peripheral Component Interconnect) bus 1315. In addition, the south bridge 1309 also controls the memory system 1 as storage device for storing various kinds of software and data, via an ATA interface.

The personal computer 1200 makes access to the memory system 1 by sectors. Writing commands, reading commands, cache flash commands, and the like, are input into the memory system 1 via the ATA interface.

In addition, the south bridge 1309 also has the function of controlling access to the BIOS-ROM 1310 and the ODD unit 1311.

The EC/KBC 1312 is a 1-chip microcomputer in which an embedded controller for power management and a keyboard controller for controlling the keyboard (KB) 1206 and the touch pad 1207 are collected.

The EC/KBC 1312 has the function of powering on/off the personal computer 1200 in accordance with an operation of a power button by a user. The network controller 1313 is a communication device to communicate with an external network such as the Internet or the like, for example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
    a nonvolatile memory including a plurality of word lines each connected to memory cells, each one of the memory cells being capable of storing at least two bits, the memory cells connected to one of the plurality of word lines, each one of the plurality of word lines including a plurality of pages, each one of the plurality of pages being a data programming unit;
    a random access memory configured to store an address translation table indicating relationships between logical addresses designated by a host apparatus and physical addresses in the nonvolatile memory; and
    a memory controller configured to:
        write first valid data in units of pages to first pages in the nonvolatile memory; execute a data fixing process to save the address translation table from the random access memory to the nonvolatile memory, the saved address translation table including relationships between logical addresses of the first valid data and physical addresses of the first pages; and
        after writing the first valid data to the first pages, and before executing the data fixing process, write dummy data to an entire page in units of pages to first unwritten pages including a second unwritten page, the second unwritten page being included in at least one word line, the at least one word line including at least one second page in which latest valid data or second latest valid data of the first valid data has been written in the nonvolatile memory, the first unwritten pages being included in two or more consecutive word lines, the first pages including the at least one second page.

2. The memory system according to claim 1, wherein the memory controller is further configured to write the dummy data in units of pages to the first unwritten pages along with the latest valid data or the second latest valid data in the nonvolatile memory, the first unwritten pages corresponding to a predetermined number of pages.

3. The memory system according to claim 2, wherein each one of the plurality of word lines includes an upper page and a lower page.

4. The memory system according to claim 3, wherein the memory controller is further configured to execute a data writing operation to the nonvolatile memory, the data writing operation including a first writing operation, and a second writing operation in a sequential order, the first writing operation being a writing operation in units of pages to the lower page in a word line (n+1), the second writing operation being a writing operation in units of pages to the upper page in a word line (n), where n is zero or a natural number.

5. The memory system according to claim 4, wherein the predetermined number of pages is at least three pages according to the data writing operation.

6. The memory system according to claim 5, wherein, if a second size is larger than a size of three pages, a size of the predetermined number of pages corresponds to the second size, the second size being a size of a unit of address translation in the address translation table.

7. The memory system according to claim 6, wherein the nonvolatile memory is a NAND flash memory.

8. The memory system according to claim 6, wherein the random access memory is a DRAM (Dynamic Random Access Memory).

9. A control method of a memory system that includes a nonvolatile memory, the nonvolatile memory including a plurality of word lines each connected to memory cells, each one of the memory cells being capable of storing at least two bits, the memory cells connected to one of the plurality of word lines, each one of the plurality of word lines including a plurality of pages, each one of the plurality of pages being a data programming unit, and a random access memory configured to store an address translation table indicating relationships between logical addresses designated by a host apparatus and physical addresses in the nonvolatile memory, the control method of the memory system comprising:
    writing first valid data in units of pages to first pages in the nonvolatile memory;
    executing a data fixing process to save the address translation table from the random access memory to the nonvolatile memory, the saved address translation table including relationships between logical addresses of the first valid data and physical addresses of the first pages; and
    after writing first valid data to the first pages, and before executing the data fixing process, writing dummy data to an entire page in units of pages to first unwritten pages including a second unwritten page, the second unwritten page being included in at least one word line, the at least one word line including at least one second page in which latest valid data of the first valid data has been written in the nonvolatile memory, the first unwritten pages being included in two or more consecutive word lines, the first pages including the at least one second page.

10. The control method of the memory system according to claim 9, wherein the writing of the dummy data includes writing the dummy data in units of pages to the first unwritten pages along with the latest valid data or the second latest valid data in the nonvolatile memory, the first unwritten pages corresponding to a predetermined number of pages.

11. The control method of the memory system according to claim 10, wherein each one of plurality of the word lines includes an upper page and a lower page.

12. The control method of the memory system according to claim 11, wherein a data writing operation to the nonvolatile memory includes executing a first writing operation, and a second writing operation, in a sequential order, the first writing operation being a writing operation in units of pages to the lower page in a word line (n+1), the second writing operation being a writing operation in units of pages to the upper page in a word line (n), where n is zero or a natural number.

13. The control method of the memory system according to claim 12, wherein the predetermined number of pages is at least three pages according to the data writing operation.

14. The control method of the memory system according to claim 13, wherein, if a second size is larger than a size of three pages, a size of the predetermined, number of pages corresponds to the second size, the second size being a size of a unit of address translation in the address translation table.

15. The control method of the memory system according to claim 14, wherein the nonvolatile memory is a NAND flash memory.

16. The control method of the memory system according to claim 14, wherein the random access memory is a DRAM (Dynamic Random Access Memory).

* * * * *